(12) United States Patent
Hayakawa

(10) Patent No.: US 7,134,892 B2
(45) Date of Patent: Nov. 14, 2006

(54) SOCKET FOR ELECTRICAL PARTS

(75) Inventor: Kenji Hayakawa, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/260,292

(22) Filed: Oct. 28, 2005

(65) Prior Publication Data

US 2006/0094280 A1    May 4, 2006

(30) Foreign Application Priority Data

Oct. 29, 2004    (JP) .............................. 2004-315344

(51) Int. Cl.
*H01R 11/22*    (2006.01)
(52) U.S. Cl. ...................................... 439/268
(58) Field of Classification Search ................ 439/268, 439/330, 331, 263, 264, 266, 269.1
See application file for complete search history.

(56) References Cited

U.S. PATENT DOCUMENTS 4,480,888 A * 11/1984 Hopkins et al. ............ 439/267

FOREIGN PATENT DOCUMENTS

JP    2002-8809    1/2002

* cited by examiner

*Primary Examiner*—Phuong Dinh
(74) *Attorney, Agent, or Firm*—Staas & Halsey LLP

(57)    ABSTRACT

A socket for an electrical part includes a socket body to which an electrical part is accommodated, the socket body having a base portion to which a number of contact pins and a movable member disposed to the socket body to be vertically movable. The movable member includes a movable member body disposed substantially horizontally and formed with the insertion holes into which contact pins are inserted, respectively, and a projection piece projecting upward from the movable member body. The projection piece has an upper surface to which a pressed surface is formed, and when the pressed surface is pressed, the movable member is lowered.

11 Claims, 18 Drawing Sheets

SOCKET FOR ELECTRICAL PARTS

BACKGROUND OF THE INVENTION

1. Field of the Invention

The present invention relates to a socket for an electrical part for detachably holding an electrical part such as a semiconductor device (called as "IC package" hereinlater).

2. Related Art

In a known art, there has been provided an IC socket, as "socket for an electrical part" for detachably holding an "IC package" as an electrical part such as disclosed in Japanese Laid-Open (KOKAI) Patent Publication No. 2002-8809.

The IC package disclosed in this publication includes a number of solder balls, as terminals, which are arranged on a lower surface of the IC package so as to protrude therefrom in an lattice arrangement including vertical rows Y and horizontal lines X.

The IC socket, on the other hand, includes a socket body in which the IC package is accommodated and which is provided with a number of contact pins contacting the terminals of the IC package. The socket body is also provided with a movable (moving) member vertically movable to elastically deform the contact pins so as to be contacted or separated to or from the terminals of the IC package.

The socket body is further provided with a lever member to vertically move the movable member to be rotatable through a rotation shaft, i.e., pivot, and an operation member for rotating or pivoting the lever member is also provided to the socket body to be vertically movable.

By vertically moving the operation member, the lever member is rotated and, hence, the movable member is vertically moved, thus elastically deforming the contact pins, and accordingly, contact portions of the contact pins are contacted to or separated from the terminals of the IC package, respectively.

However, in the conventional structure of the IC socket mentioned above, in order to vertically move the movable member, it was necessary to apply a driving force of the operation member to the movable member through the lever member, and accordingly, the increased number of elements or members such as lever member is required, resulting in a troublesome arrangement working or like.

SUMMARY OF THE INVENTION

The present invention was then conceived to eliminate the defects or inconveniences encountered in the prior art mentioned above and an object of the present invention is to provide a socket for an electrical part having reduced number of constitutional members or elements in comparison with the conventional structure.

This and other objects can be achieved according to the present invention by providing a socket for an electrical part comprising:

a socket body to which an electrical part is accommodated, the socket body having a base portion to which a plurality of contact pins, having elastic pieces, which are contacted to or separated from terminals of the electrical part, are arranged; and a movable member disposed to the socket body above the base portion thereof to be vertically movable, deformation of the elastic pieces of the contact pins inserted into an insertion hole formed to the movable member being performed in accordance with the vertical movement of the movable member, according to the deformation thereof, contact portions formed to the contact pins being opened or closed, the movable member including a movable member body disposed substantially horizontally and formed with the insertion holes into which the contact pins are inserted, respectively, and a projection (piece) projecting upward from the movable member body, the projection having an upper surface to which a pressed surface is formed, wherein when the pressed surface is pressed, the movable member is lowered.

In a preferred embodiment, it may be desired that the pressed surface of the projection is formed so as to be along substantially the horizontal direction.

It may be also desired that the projection is formed to an outer peripheral edge portion of the movable member body, and an accommodation member, in which the electrical part is to be accommodated, is formed to the outer peripheral edge portion of the movable member body at a position inside the projection.

The accommodation member may be provided with an engaging piece through which the accommodation member is detachably provided for the socket body.

The accommodation member may be provided with a guide portion for guiding the electrical part when the electrical part is accommodated.

The socket may further comprise an operation member mounted to the socket body to be vertically movable, the operation member being formed with a pressing surface pressing the pressed surface of the movable member.

According to the present invention of the structures mentioned above, the projection (piece) is formed to the movable member so as to project upward from the movable member body so that the pressed surface formed to the upper surface of the projection is directly pressed by the operation member, thus reducing the number of the members or parts, such as link member, to be provided.

By forming the projection projecting upward from the movable member body, it is not necessary to form any projection to the operation member, thus simplifying the structure and ensuring the strength and durability of the socket. Incidentally, if a projection projecting downward is formed to the operation member, it is needed to adopt a shape recessed into the socket body, so that the structure of the operation member is made complicated and the projection will have a weak fine and slender shape.

Furthermore, the pressed surface of the movable member is horizontal and perpendicular to the pressing direction (vertical direction) different from an inclined surface, so that there is no friction between the pressing surface of a head on a package insertion/take-out device side and the pressed surface of the movable member, thus ensuring the durability.

Still furthermore, since the accommodation member is disposed inside the projection, the accommodation member does not constitute an obstacle at the time of pushing the projection by the operation member. In addition, as it is necessary to accommodate the electrical part above the movable member, the accommodation member is disposed inside the projection, thus suitably accommodating the electrical part.

The accommodation member may be attached detachably to the socket body through the engaging piece, so that the movable member can be easily dismounted together with the accommodation member. In addition, since the guide portion is formed to the accommodation member, the electrical part can be smoothly guided to the predetermined position when accommodated.

The nature and further characteristic features of the present invention will be made more clear from the following descriptions made with reference to the accompanying drawings.

BRIEF DESCRIPTION OF THE DRAWINGS

In the accompanying drawings:

FIG. 8 shows the contact pin of the IC socket of the fist embodiment, in which

DESCRIPTION OF THE PREFERRED EMBODIMENTS

Figure 1:
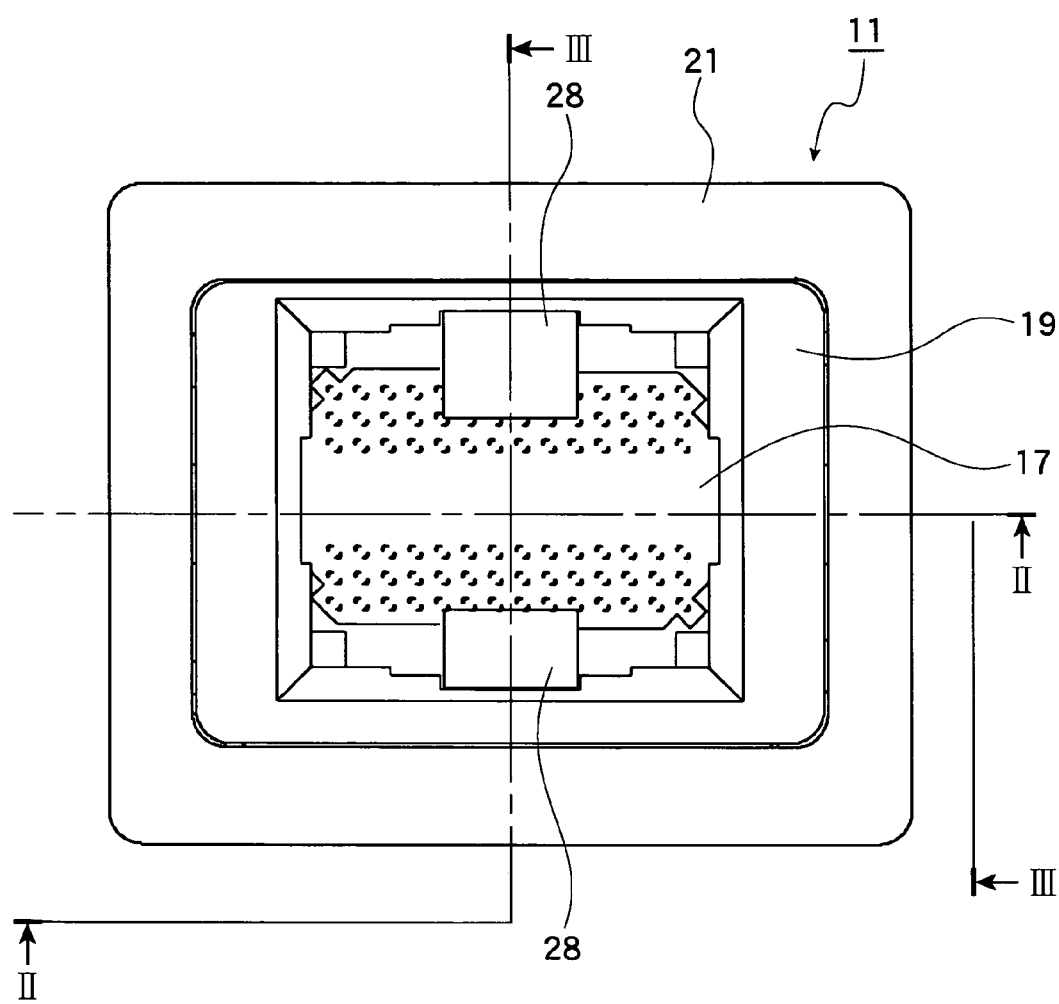
FIG. 1 is a plan view of an IC socket according to a first embodiment of the present invention.

Preferred embodiments of the present invention will be described hereunder with reference to the accompanying drawings.

[First Embodiment]

FIGS. 1 to 14 represent a first embodiment of an IC socket as a socket of an electrical part. Further, it is first to be noted that terms "right", "left", "upper", "lower" and the like terms are used herein with reference to the illustrated state on the drawings or in a generally using state of the IC socket of this kind.

With reference to FIGS. 1 to 14, reference numeral 11 denotes an IC socket as "a socket for an electrical part", which is a socket for establishing an electrical connection between a solder ball 12b as a terminal of an IC package 12 as "an electrical part" and a printed circuit board, not shown, of a measuring device such as tester, for carrying out a performance test of the IC package 12.

Figure 6:
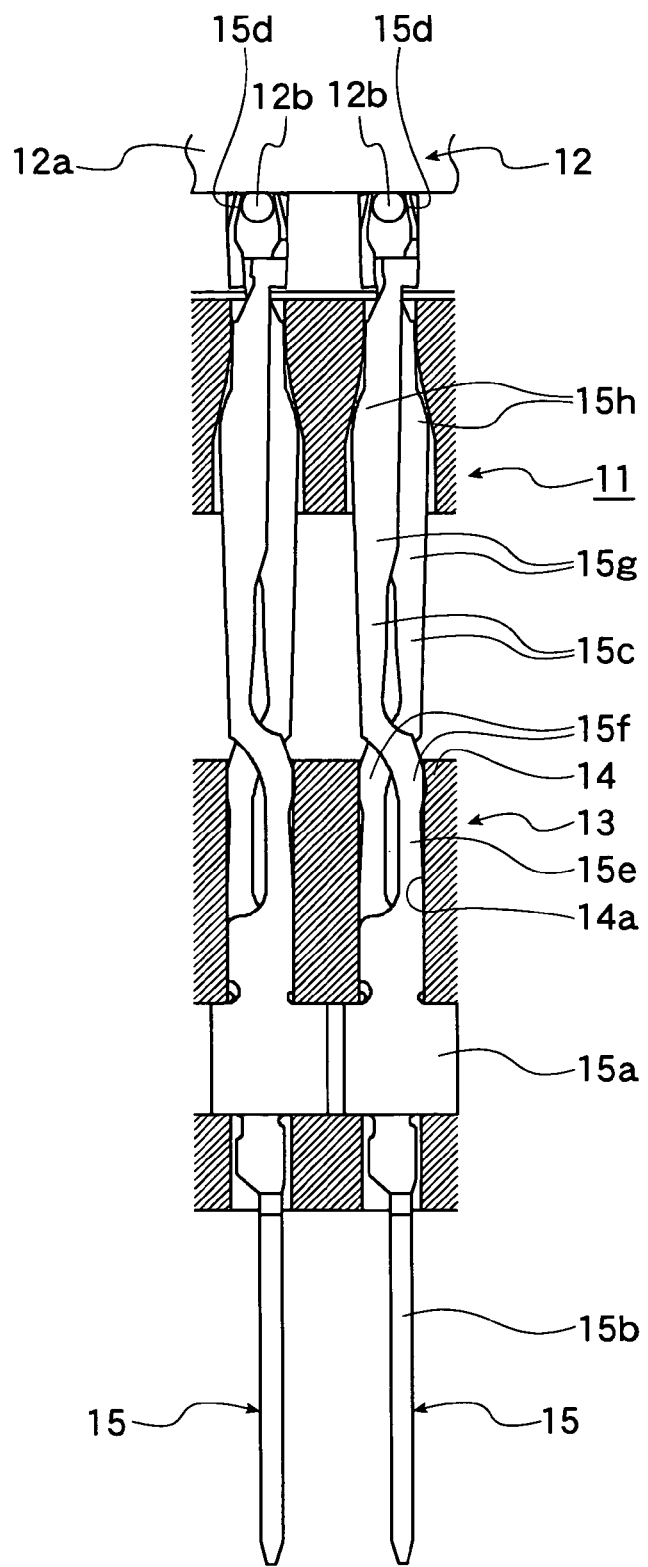
FIG. 6 is a sectional view of a contact pin, in an enlarged scale, in a location when the movable member takes its uppermost position in the first embodiment.

The IC package 12 is so-called an BGA (Ball Grid Array) type, such as shown in FIG. 6, in which terminals 12b, each in a spherical shape, are arranged to a lower surface of a square package body 12a of the IC package 12 so as to protrude therefrom in vertical lines and horizontal rows to provide a matrix arrangement.

Figure 2:
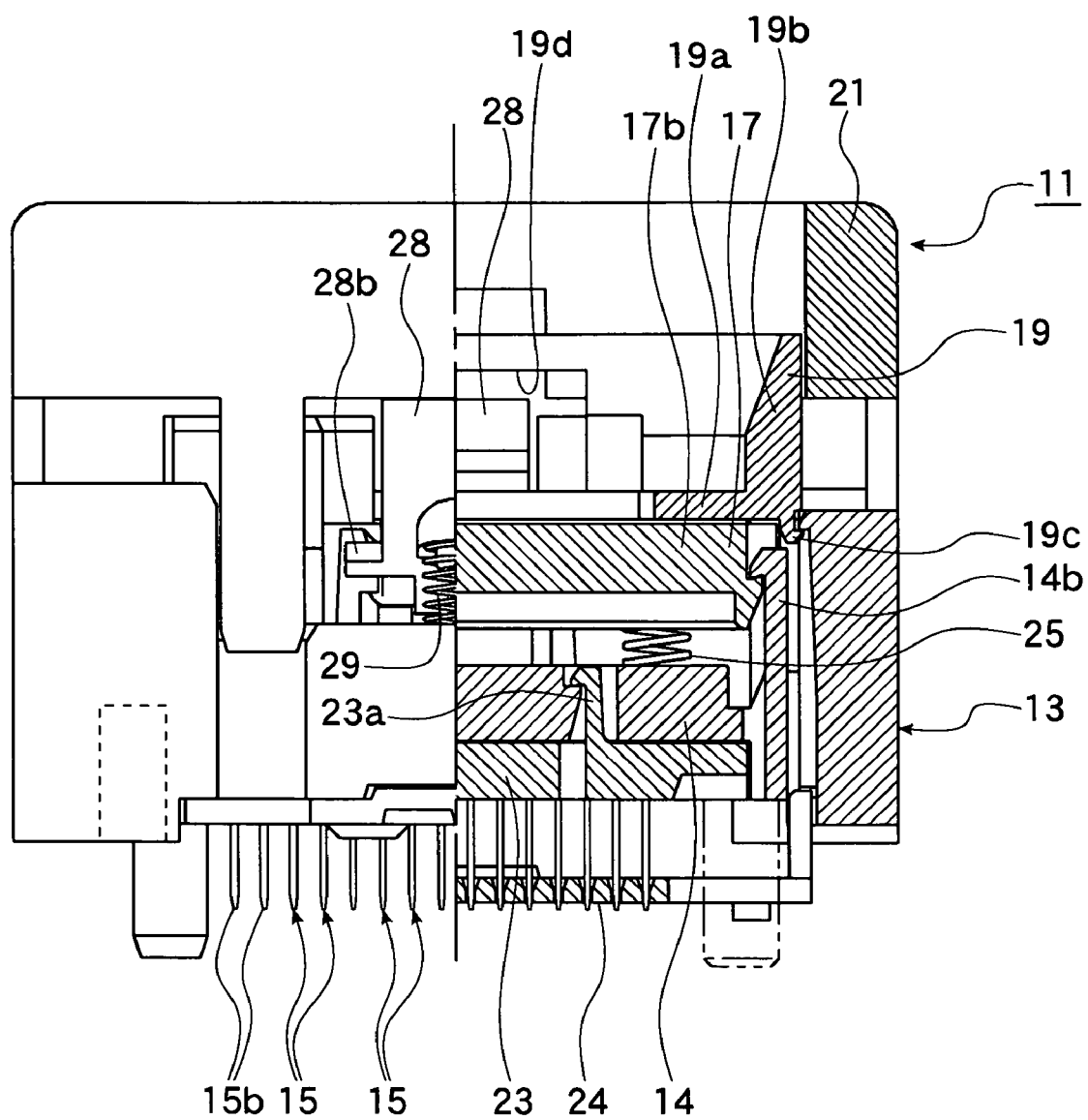
FIG. 2 is a sectional view taken along the line II—II in FIG. 1.

On the other hand, as shown in FIG. 2, the IC socket 11 has a socket body 13, made of synthetic resin, to be mounted on a printed circuit board, not shown, and this socket body 13 is provided with a number of contact pins 15 contacting to and separating from the solder balls 12b, respectively, of the IC package 12. The socket body 13 is also provided with a movable (moving) member 17 for displacing the contact pins 15, and an accommodation member 19 is fixed to the socket body on the upper side of the movable member 17. Furthermore, an operation (or operating) member 21 is also disposed to the socket body 13 so as to vertically move the movable member 17.

Figure 7:
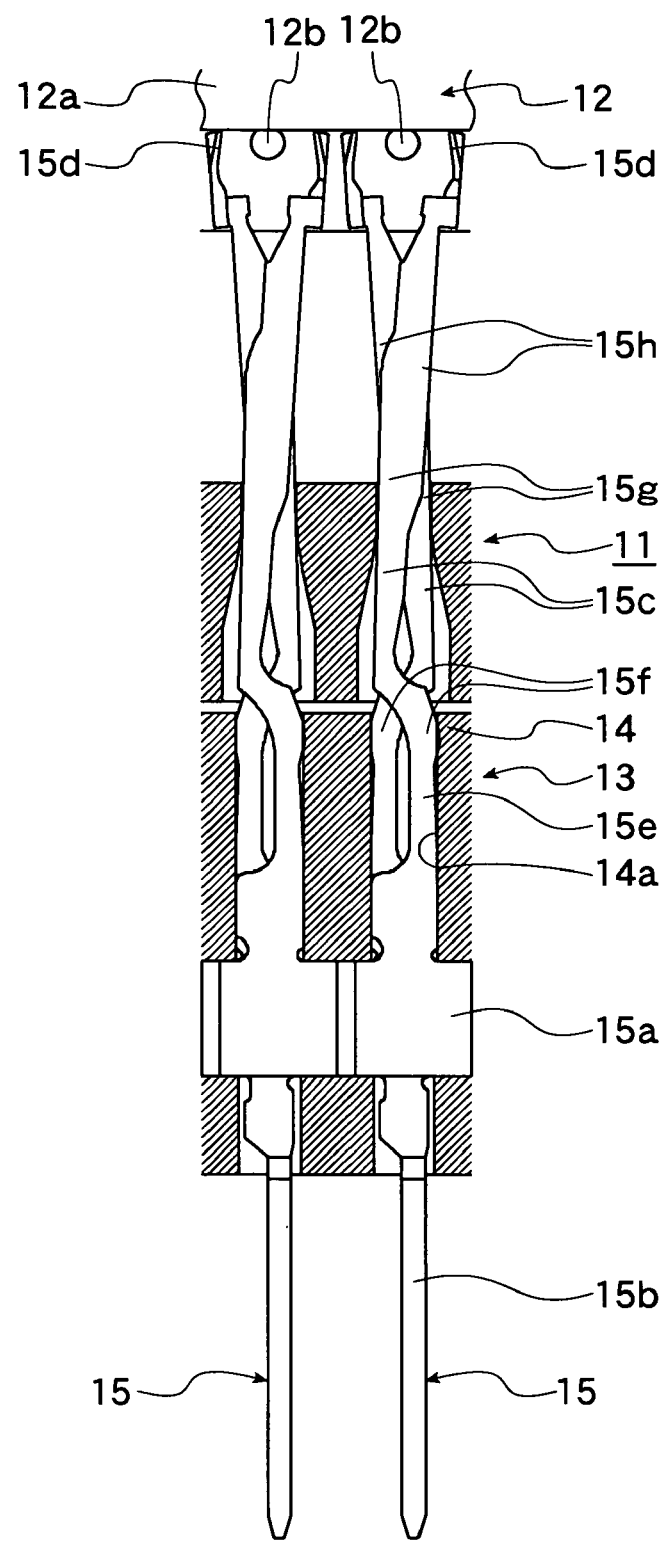
FIG. 7 is a sectional view of a contact pin, in an enlarged scale, in a location when the movable member takes its lowermost position in the first embodiment.
Figure 8A:
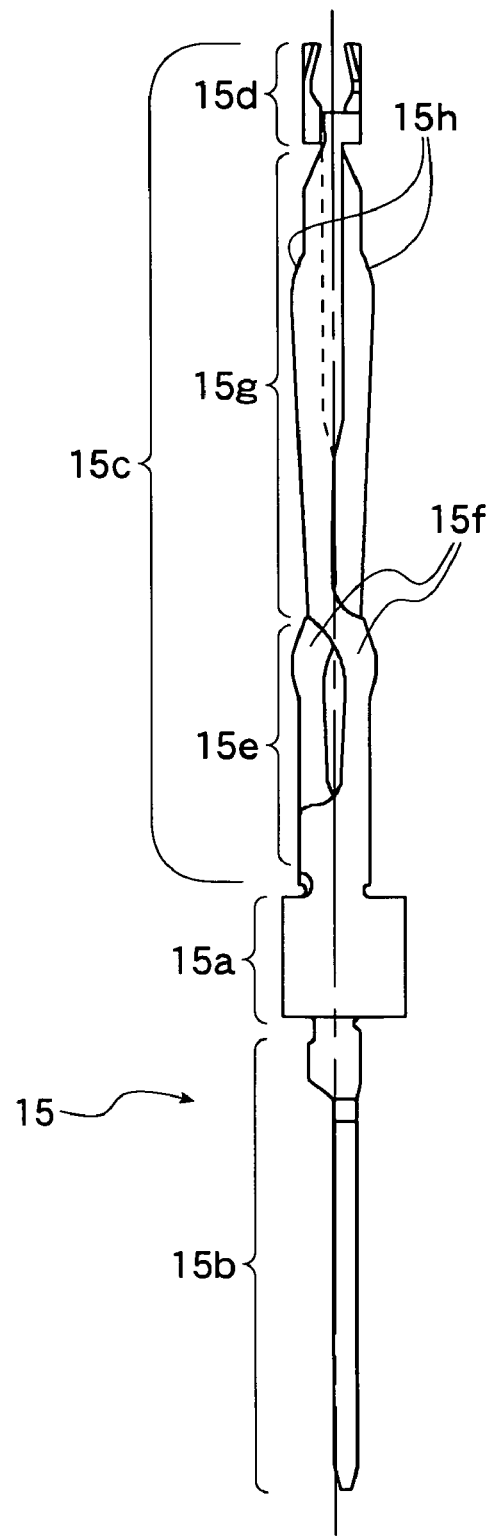
FIG. 8A is a front view of the contact pin and FIG. 8B is a right side view of FIG. 8A.
Figure 8B:
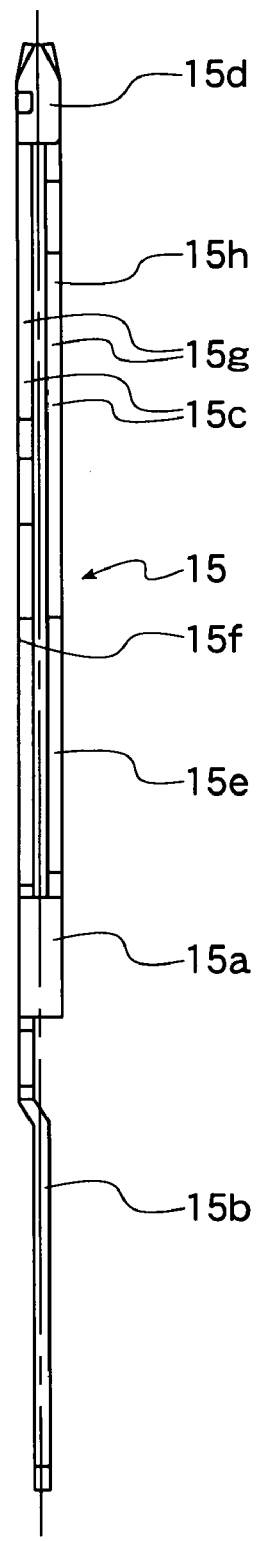

The contact pin 15 is formed from a plate member, rich in a springy property and electrical conductivity, through a press working in a shape as shown in FIGS. 6 to 8.

More specifically, the contact pin has a base portion 15a having U-shape in section at an intermediate portion of the contact pin 15 in its vertical direction and also has a solder tale portion 15b formed to the lower side of the base portion 15a and has a pair of elastic pieces 15c formed to the upper side of the base portion 15a.

The paired elastic pieces 15c have lower end sides commonly formed as the U-shaped base portion 15a, and accordingly, these elastic pieces face to face each other. The elastic pieces 15c have upper end sides (front free end side portions) to which contact portions 15d are formed so as to contact or separate from the side portion of the solder ball 12b, so that when the solder ball 12b is clamped between these paired contact portions 15d, the electrical connection can be established.

Furthermore, the paired elastic pieces 15c have lower portions 15e which are inserted into insertion hole 14a of a base member or base portion 14, and preloading projections 15f are formed to the upper sides of these lower portions 15e so as to project sideways. These preloading projections 15f abut against an inner wall of the insertion hole 14a to thereby be elastically deformed in a direction along which the contact portions 15d are closed and to apply the preload.

In addition, sliding or slidable portions 15g are formed to the upper sides of the lower portion 15e of the paired elastic pieces 15c so as to project in a direction opposite to the lower portion (15e) side. The slidable portions 15g project over the base member 14 and inserted into an insertion hole 17a of the movable member 17. When the movable member 17 moves vertically, the inner wall portions of the insertion hole 17a slide along the slidable portions 15g and, hence, the elastic pieces 15c are elastically deformed, thereby opening or closing the paired contact portions 15d.

The insertion hole 17a of the movable member 17 has a shape downward opened, as viewed such as shown in FIG. 6. Further, the slidable portions 15g are formed with bulged portions 15*h*, respectively, and when these bulged portions 15*h* are pushed, both contact portions 15*d* are moved in opening direction as shown in FIG. 7.

Still furthermore, both contact portions 15*d* project upward, as shown in FIG. 6, over the movable member 17 in its uppermost position, and are bent, at the upper end of the slidable portions 15*g*, at substantially right angle so as to face each other to thereby clamp the solder ball 12*b* between the contact pin 15 of the IC socket 11 and the solder ball 12*b* of the IC package 12 to establish the electrical connection therebetween.

Figure 4:
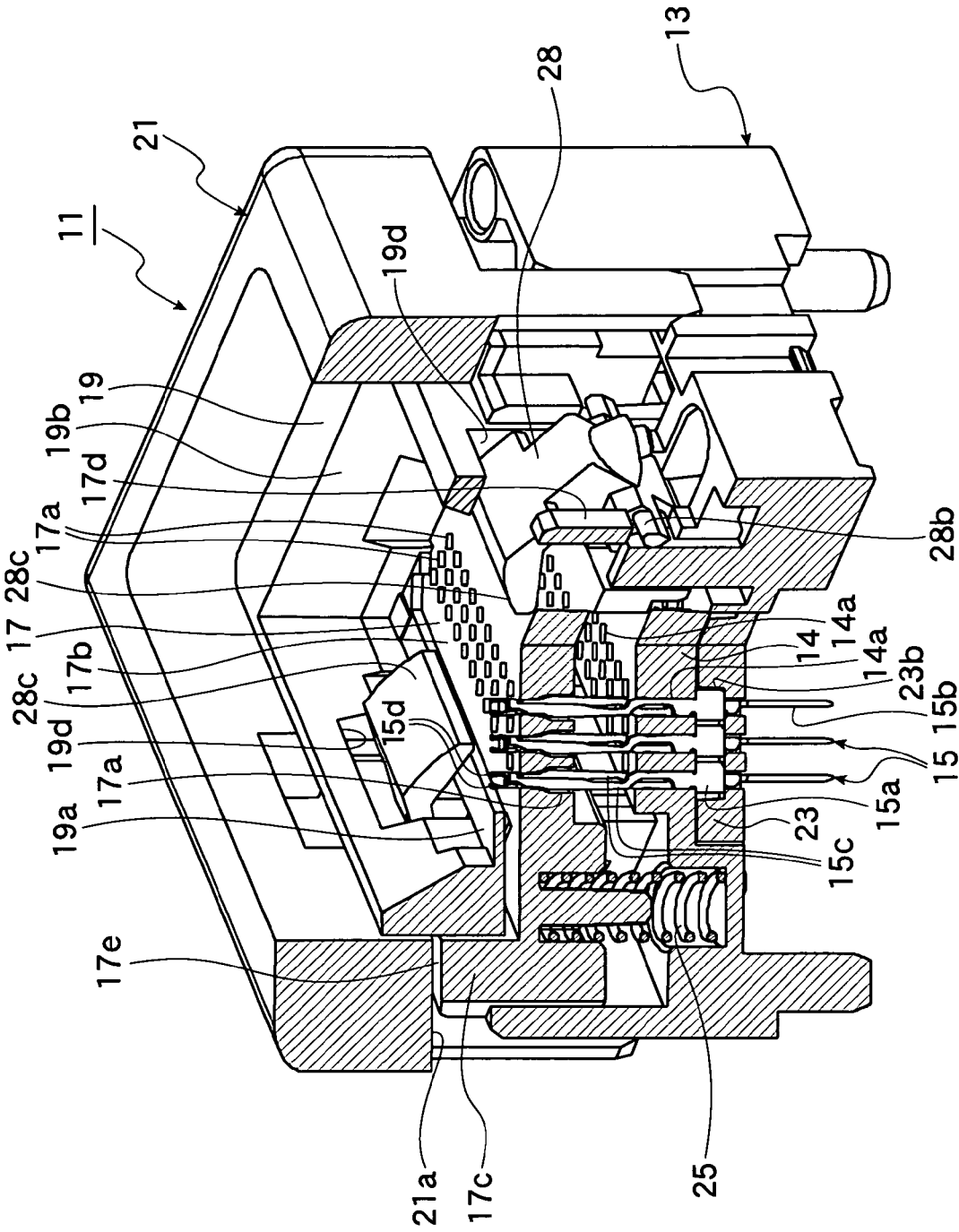
FIG. 4 is a perspective view, partially in section, of the IC socket of the first embodiment, in which a movable member takes an uppermost position thereof.

Further, as shown in FIG. 2, a bottom plate 23 is attached to a lower surface side of the base member 14 by means of engaging piece 23*a*. The bottom plate 23 is formed with insertion holes 23*b* through which the solder tale portions 15*b* of the contact pins 15 are inserted as shown in FIGS. 4 and 6. The base portion 15*a* of the contact pin 15 is clamped between the bottom plate 23 and the base member 14 to thereby prevent the bottom plate from moving downward.

Figure 3:
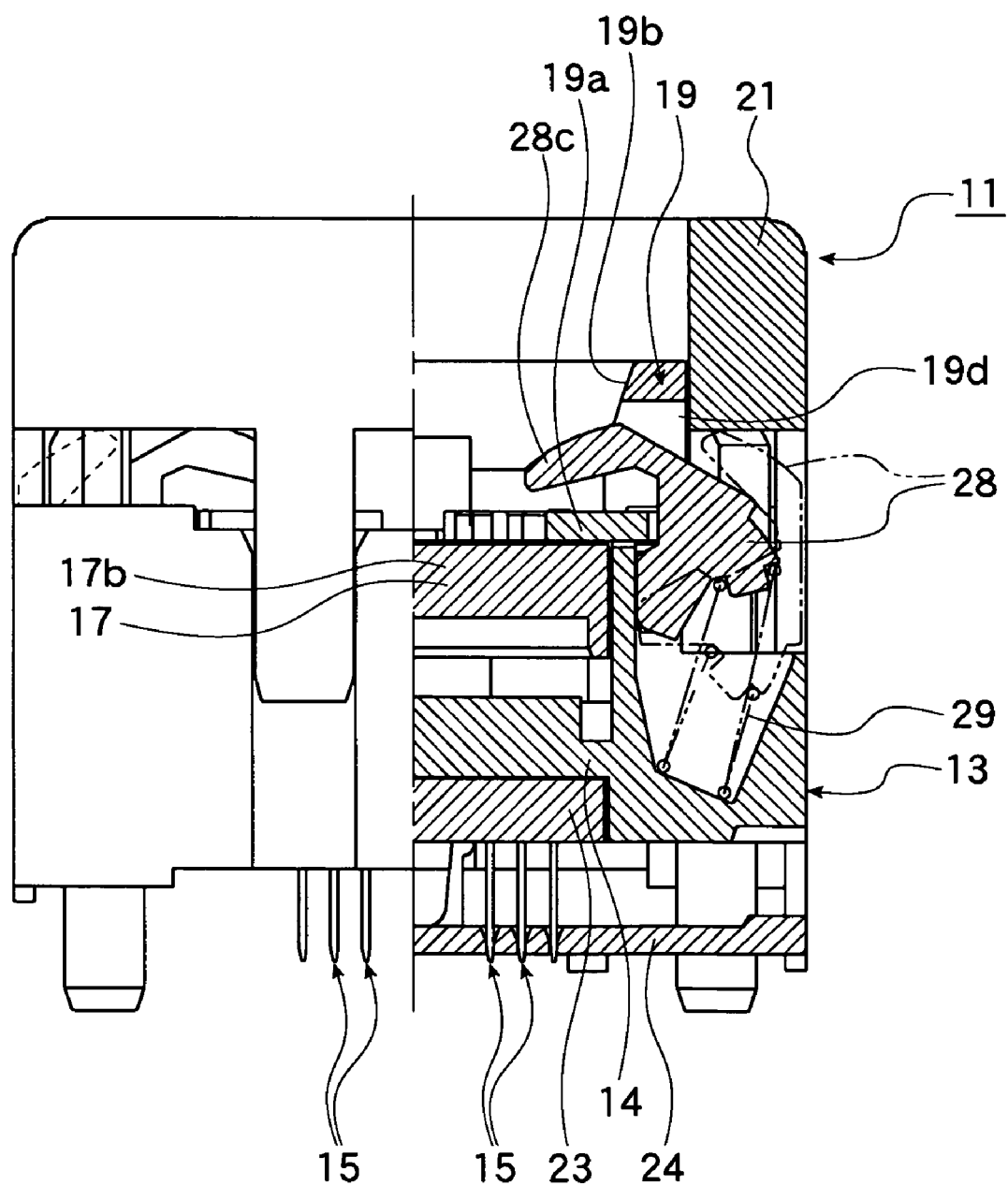
FIG. 3 is a sectional view taken along the line III—III in FIG. 1.

In addition, a location board 24 is disposed to the lower side of the bottom plate 23 to be vertically movable. Each of the solder tail portions 15*b* projecting downward from the bottom plate 23 further projects downward through the location board 24 as shown in FIG. 2 or 3, and then, is inserted into a through hole formed to a printed circuit board, not shown, and then soldered thereto, thus completing the connection.

According to such connection, a number of contact pins 15 are arranged into matrix as shown in FIG. 1 including a plurality of rows and lines.

Figure 9:
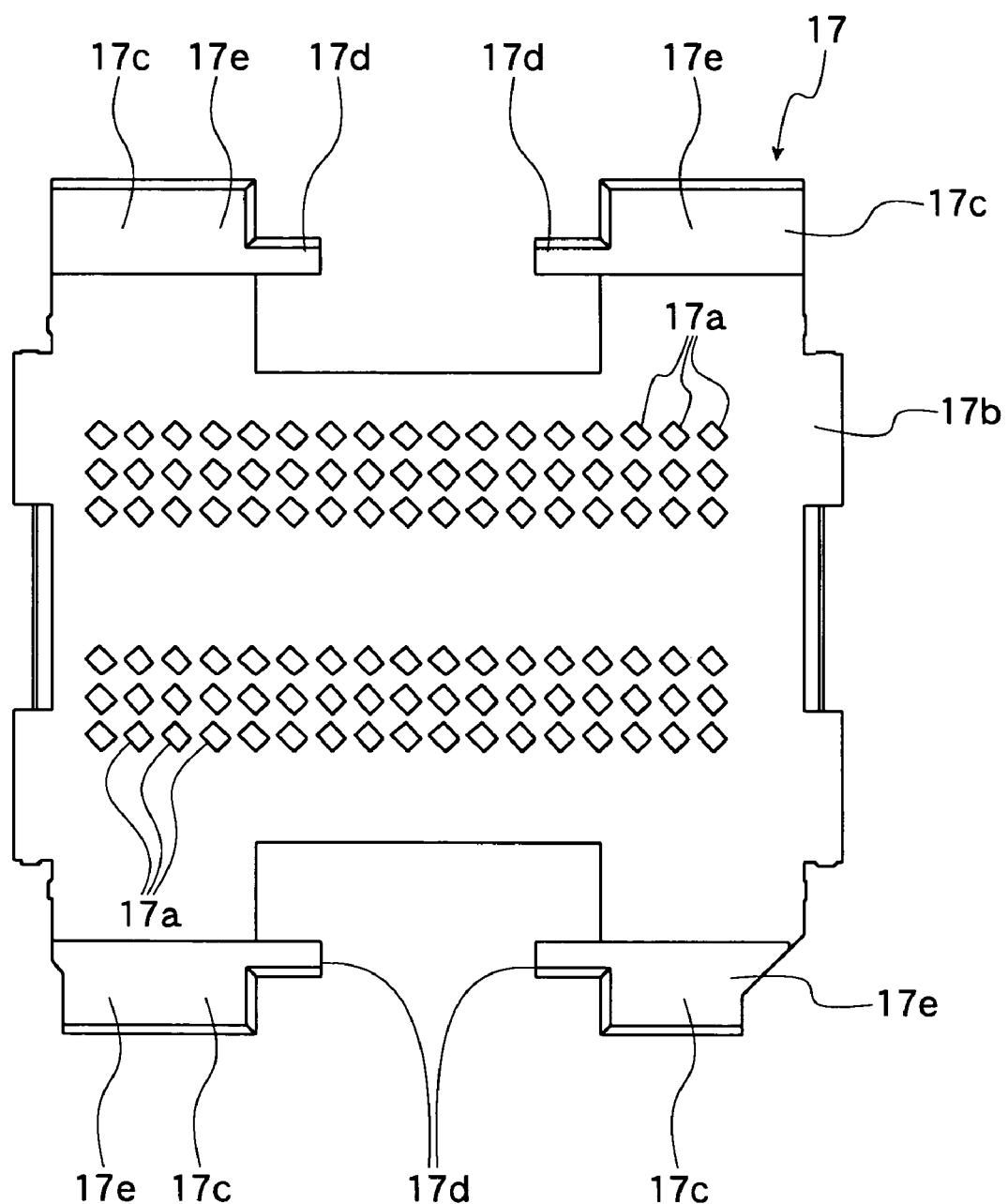
FIG. 9 is a schematic plan view of the movable member of the IC socket of the first embodiment of the present invention.
Figure 10:
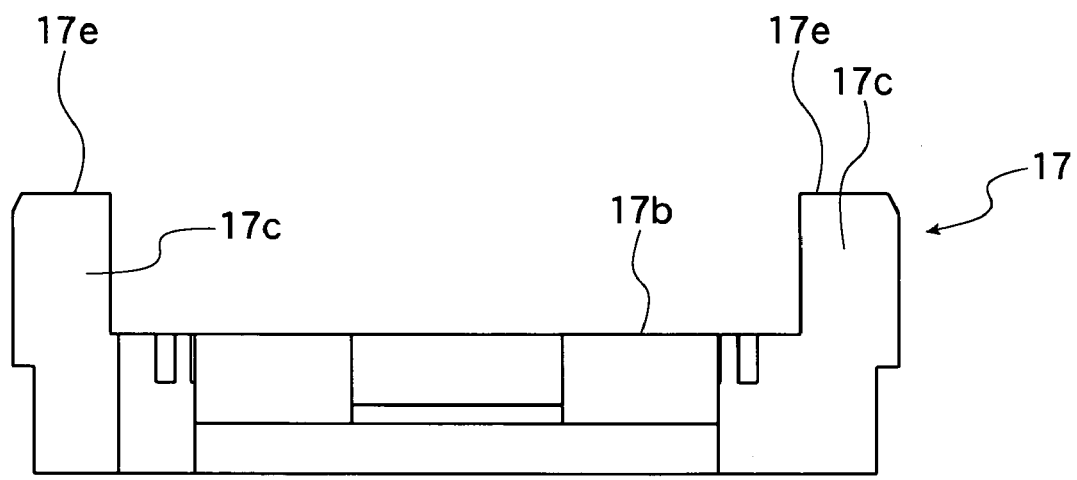
FIG. 10 is a right side view of the movable member of FIG. 9.
Figure 11:
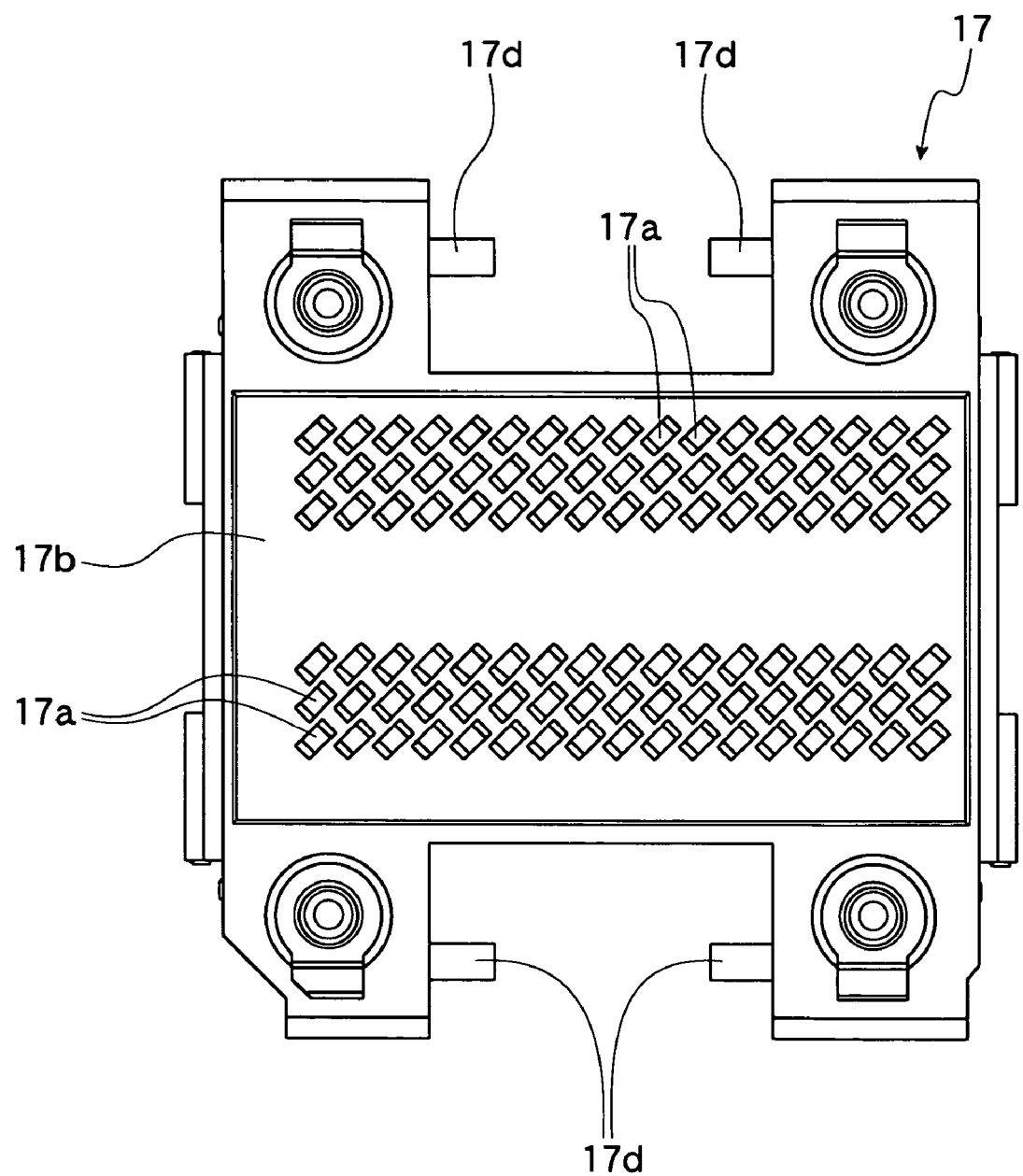
FIG. 11 is a bottom view of the movable member of FIG. 9.

In the meantime, the movable member 17 has, as shown in FIGS. 9 to 11, a movable member body 17*b* in the form of plate, extending in a horizontal direction, to which a number of insertion holes 17*a* are formed and projection pieces 17*c* projecting upward from end edge portions of the movable member body 17*b*. The projection piece 17*c* is formed with a surface 17*e* to be pressed (pressed surface) along substantially horizontal direction on the upper end surface thereof.

The movable member 17 is urged upward by a coil spring 24, and the upward movement of the movable member 17 is restricted by the engagement of the engaging portion 14*b* projecting from the base member 14 as shown in FIG. 2.

Further, as shown in FIG. 2, a frame-shaped accommodation member 19 is disposed inside each of the projection piece 17*c* above the movable member 17. The accommodation member 19 is formed with a support piece 19*a* supporting a peripheral edge portion of the package body 12*a*, and a guide or guide piece 19*b* is disposed to the peripheral edge portion of the support piece 19*a* so as to project upward. According to the location of such guides 19*b*, the IC package 12 is guided when accommodated to the IC socket. The accommodation member 19 is also provided with an engaging piece 19*c* projecting downward as shown in FIG. 2, and by engaging this engaging piece 19*c* with the base member 14, the accommodation member 19 is secured. The accommodation member 19 is formed with an opening 19*d* through which a latch member 28 is inserted or withdrawn or taken out, as mentioned hereinlater.

Figure 5:
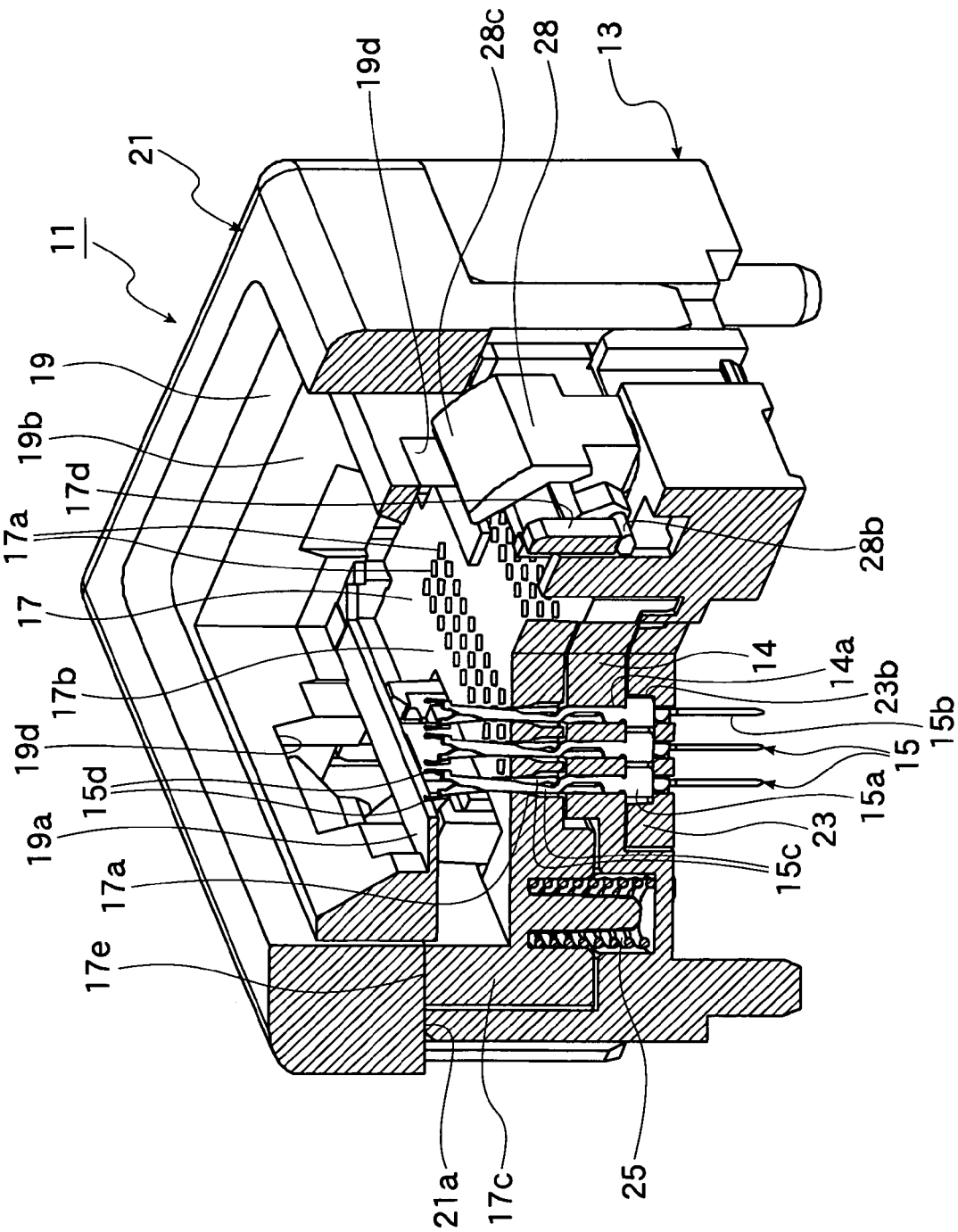
FIG. 5 is a perspective view, partially in section, of the IC socket of the first embodiment, in which a movable member takes a lowermost position thereof.
Figure 12:
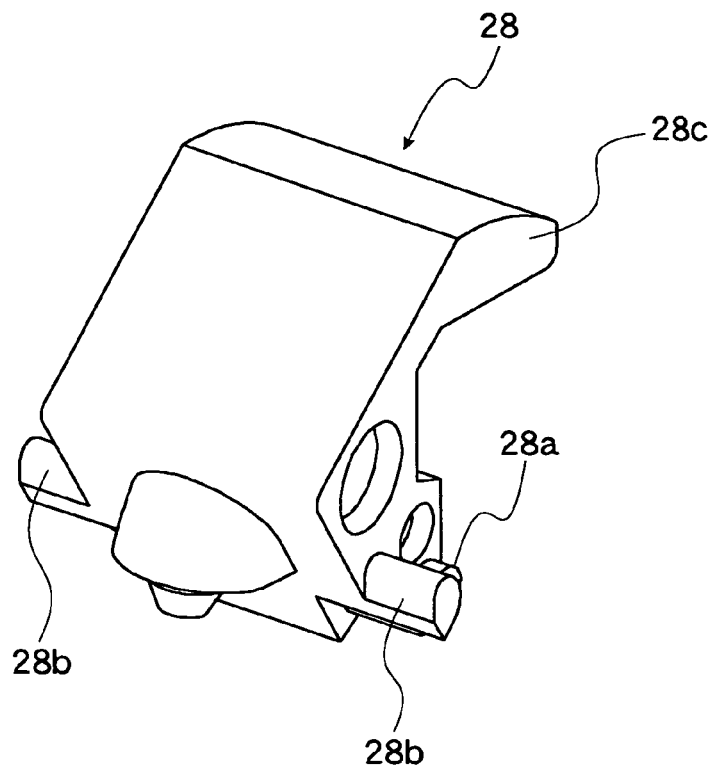
FIG. 12 is a perspective view of a latch member, viewed from an obliquely upper position, according to the first embodiment.
Figure 13:
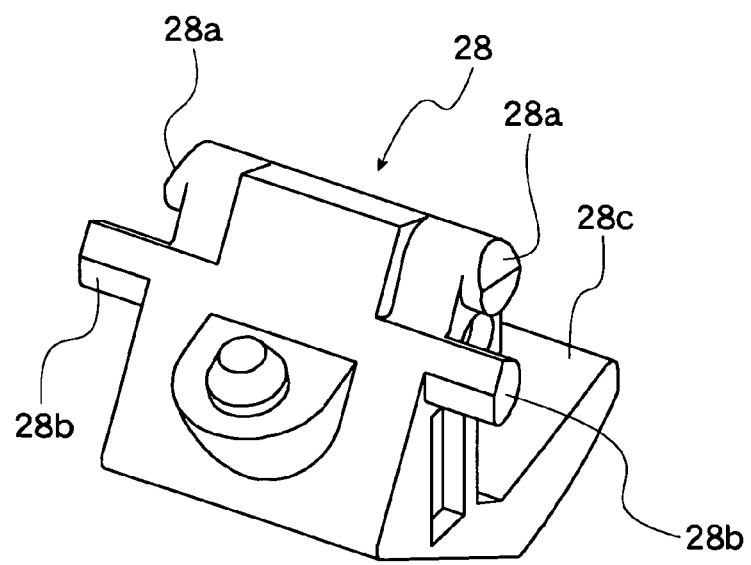
FIG. 13 is a perspective view of a latch member, viewed from an obliquely lower position, according to the first embodiment.
Figure 14:
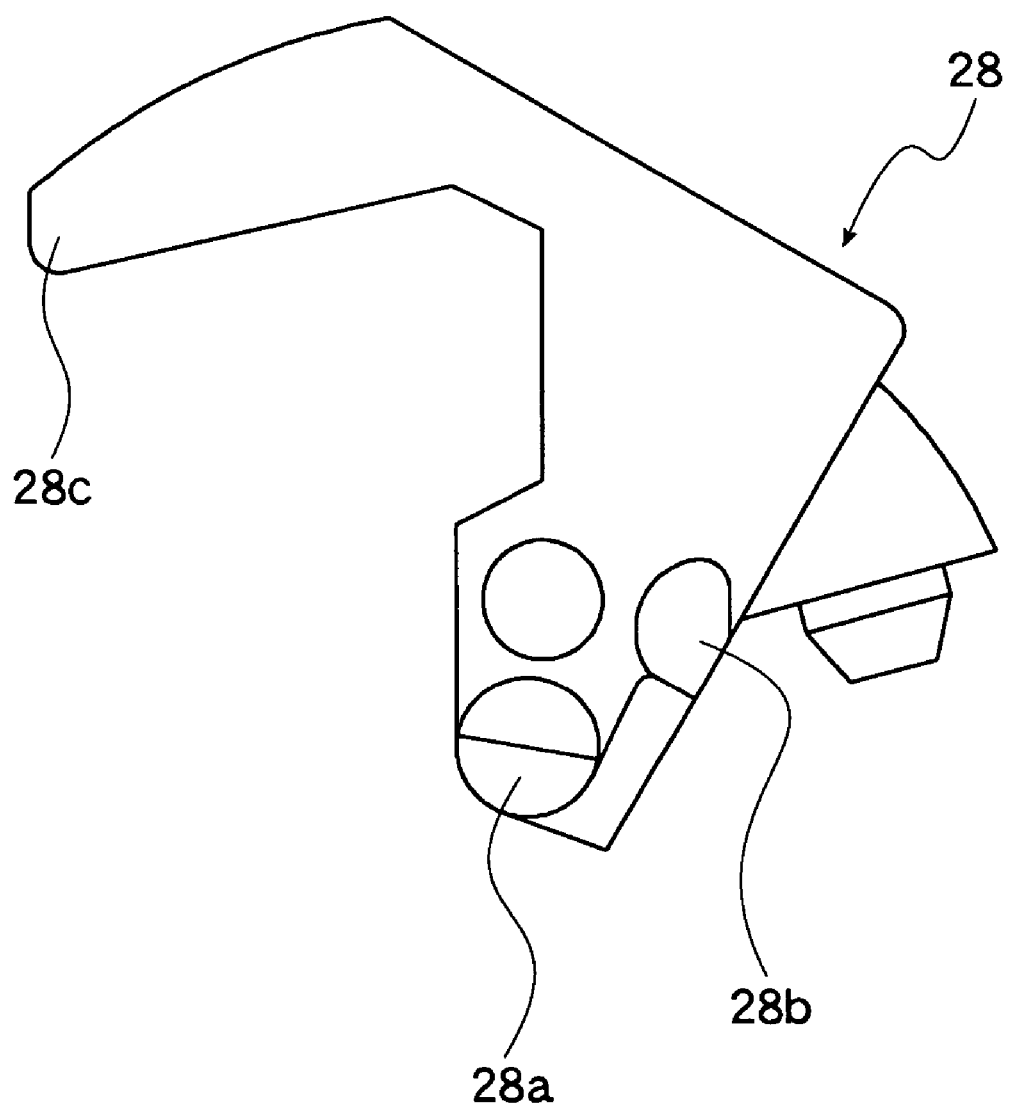
FIG. 14 is a side view of the latch member.
Figure 15:
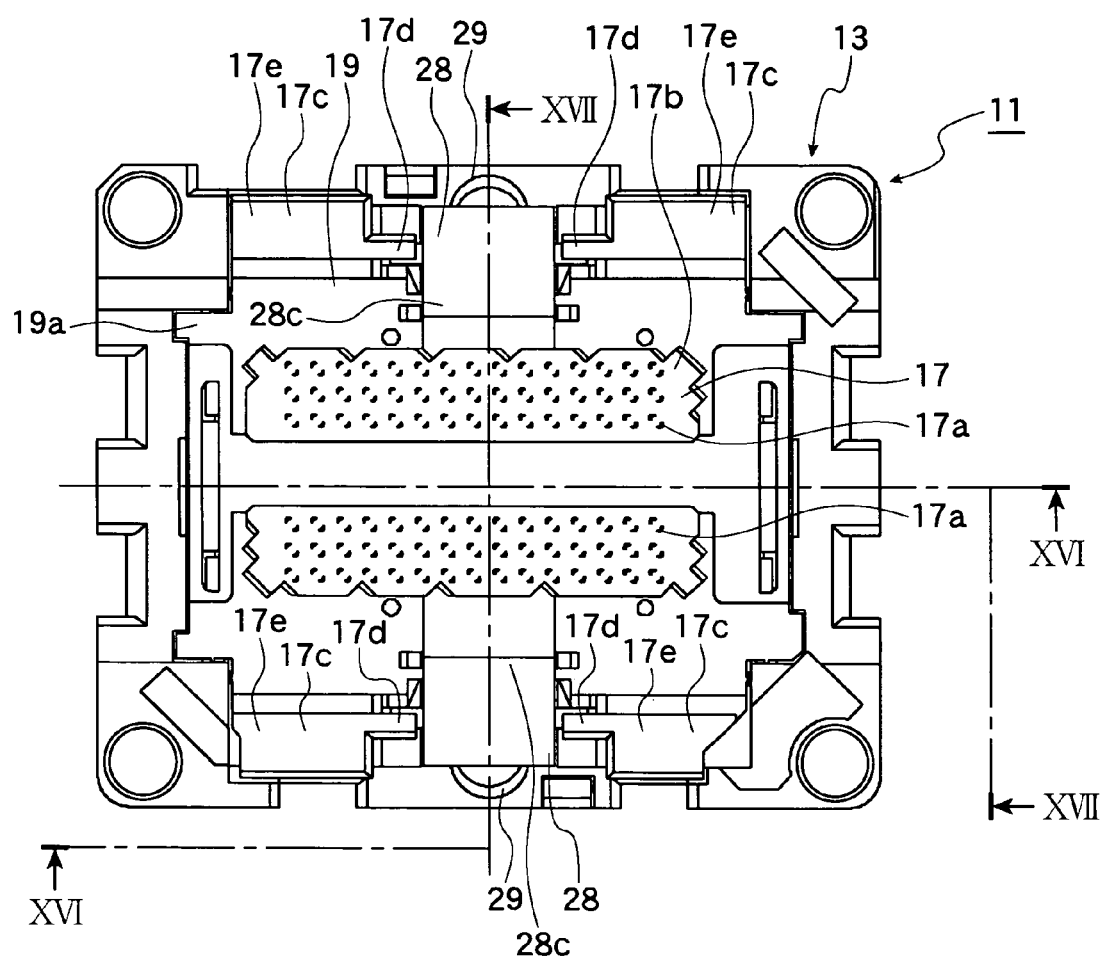
FIG. 15 is a plan view of an IC socket according to a second embodiment of the present invention.
Figure 16:
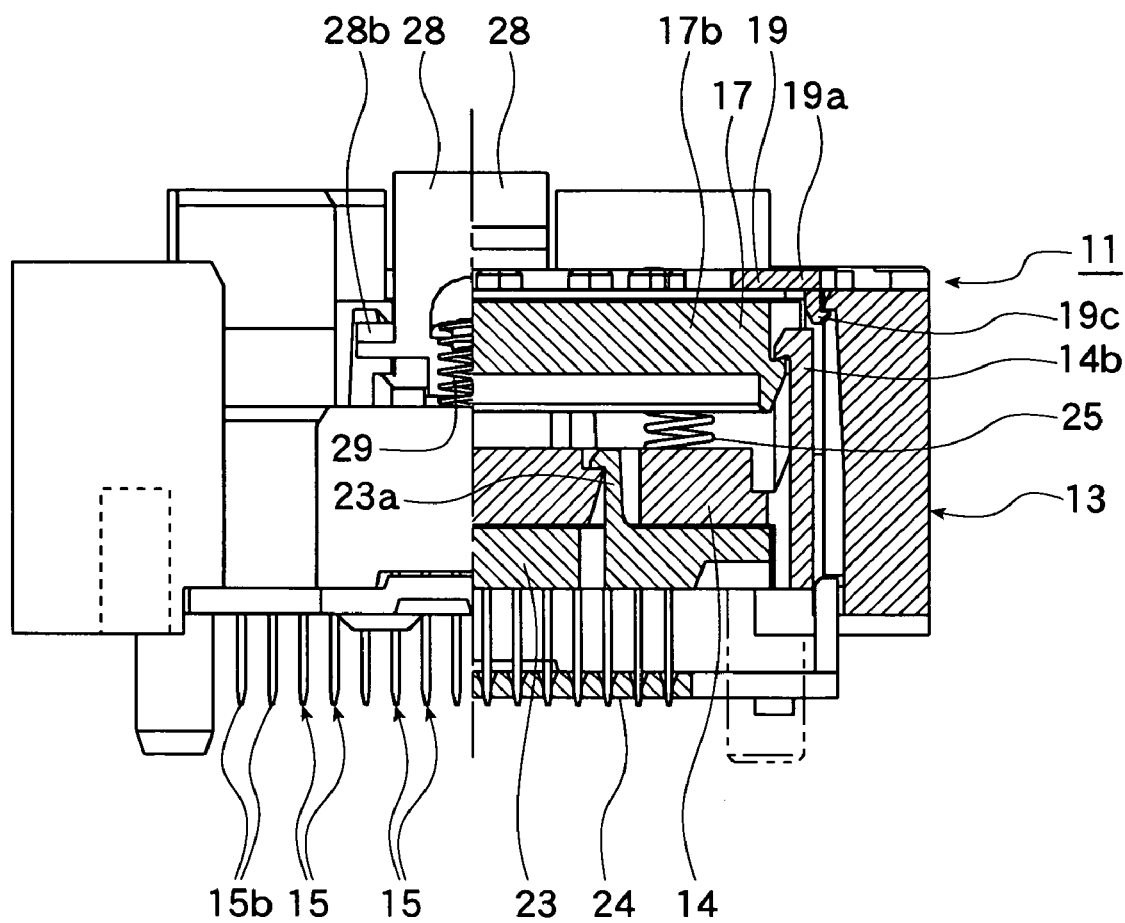
FIG. 16 is a sectional view taken along the line XVI—XVI in FIG. 15.
Figure 17:
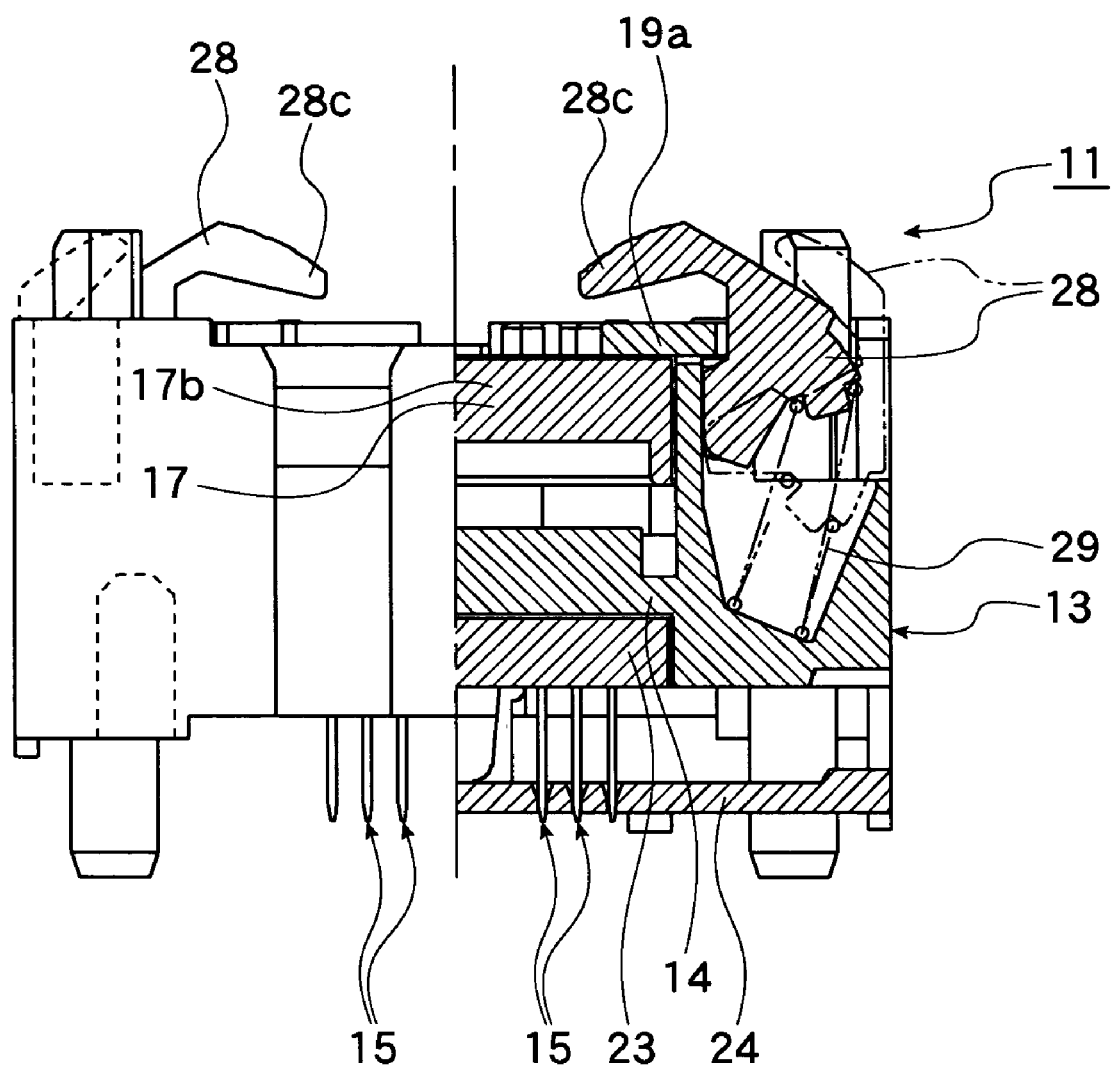
FIG. 17 is a sectional view taken along the line XVII—XVII in FIG. 15.
Figure 18:
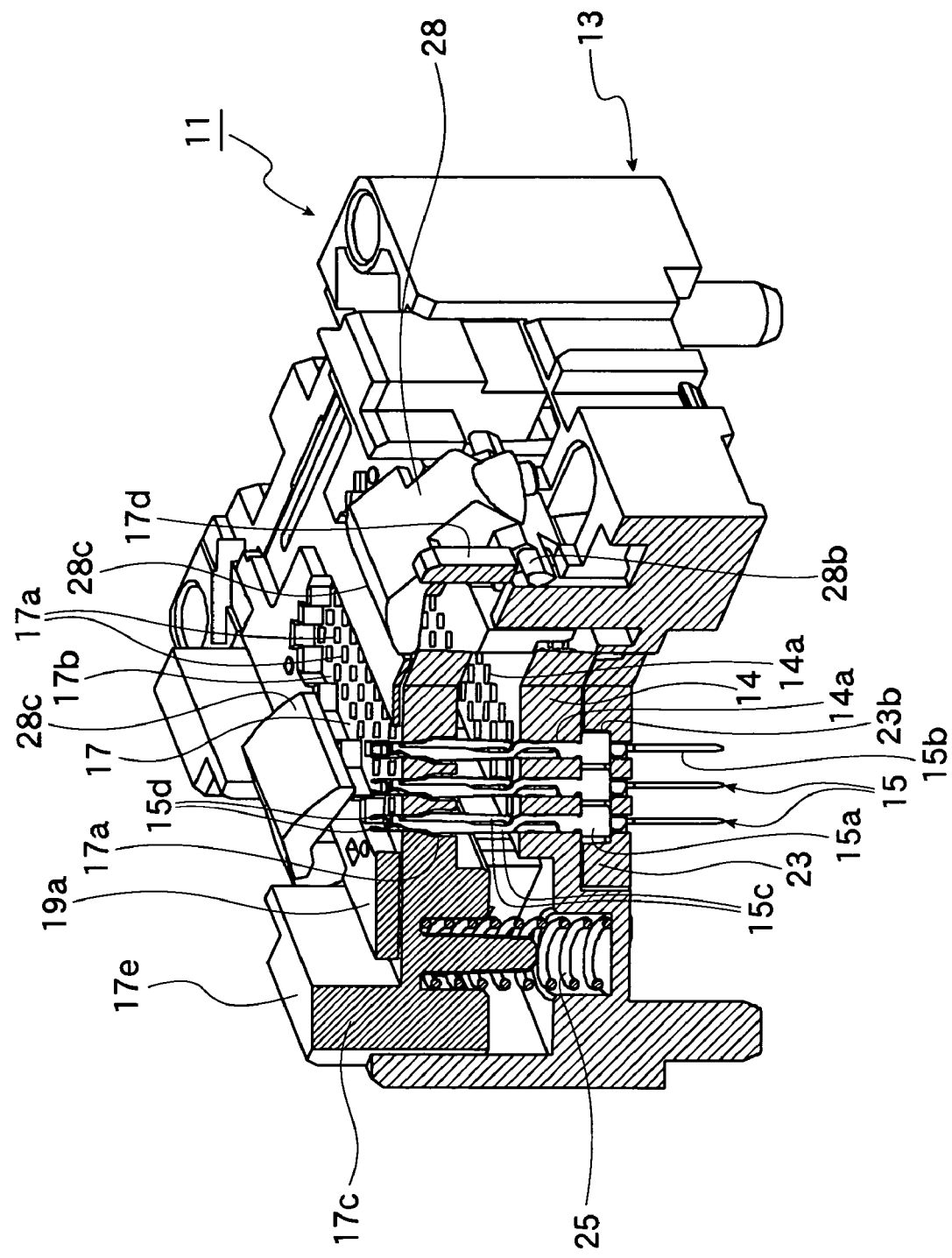
FIG. 18 is a perspective view, partially in section, of the IC socket of the second embodiment, in which a movable member takes an uppermost position thereof.
Figure 19:
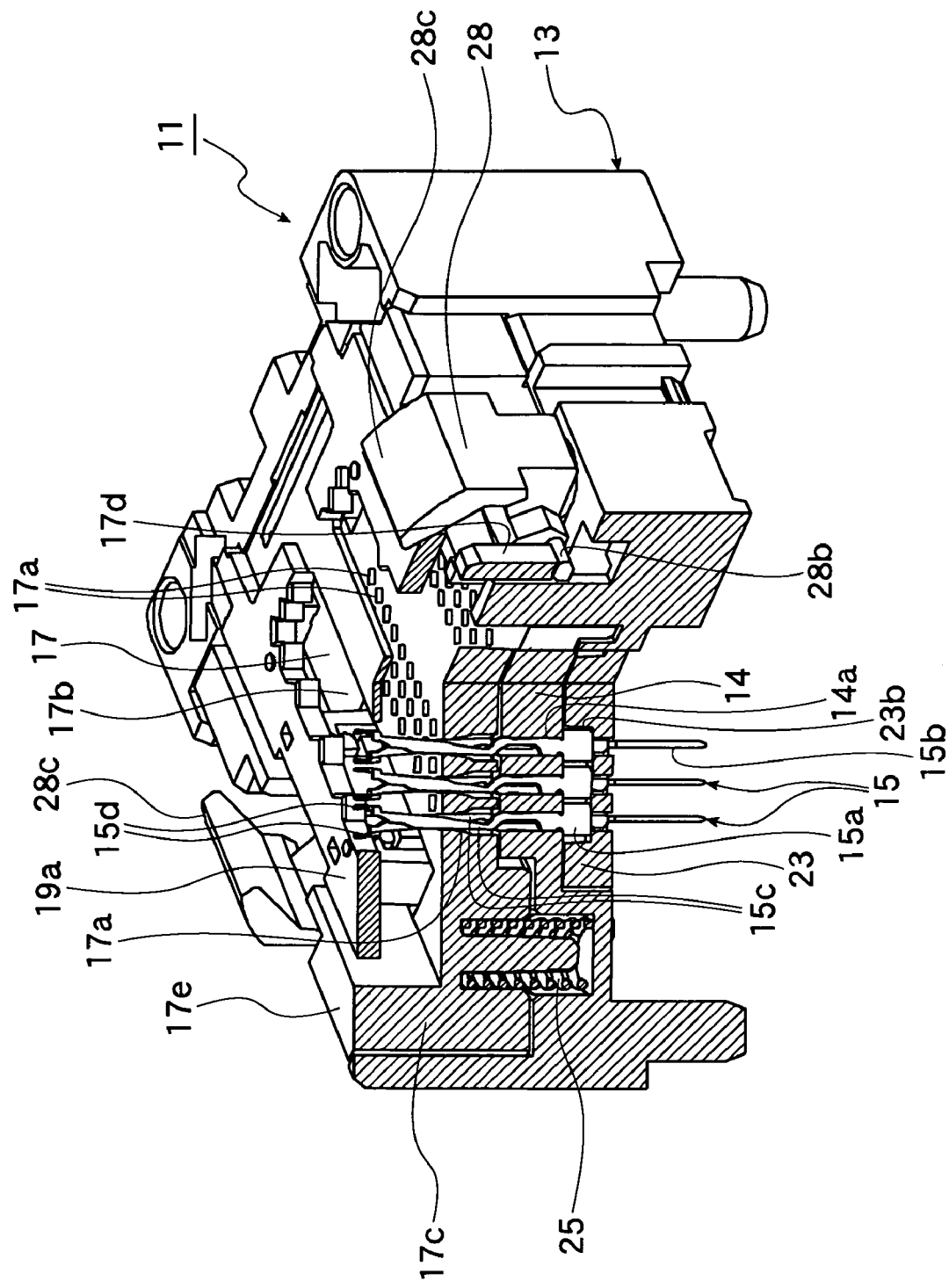
FIG. 19 is a perspective view, partially in section, of the IC socket of the second embodiment, in which a movable member takes a lowermost position thereof.

The latch member 28 includes, as shown in FIGS. 12 to 14, a rotation shaft (pivot) 28*a*, to which the socket body 13 is provided to be rotatable (pivotal). As also shown in FIG. 5, the latch member 28 is formed, at side portions thereof, with a pair of portions 28*b* to be pressed (pressed portions 28*b*) by a pressing portion 17*d* of the movable member 17. Furthermore, the latch member 28 is, as shown in FIG. 3, urged by a spring 29 in a direction to be closed, and a pressing portion 28*c* formed to the front end portion of the latch member 28 abuts against the upper surface of the peripheral edge portion of the IC package 12 to press down the IC package 12.

When the movable member 17 is moved downward, the pressing portion 17*d* of the movable member 17 presses the pressed portion 28*b* of the latch member 28, and then, the latch member 28 is rotated to be opened from a position shown with solid line in FIG. 3 to a position shown with a two-dot chain line in FIG. 3. Then, the pressing portion 28*c* of the latch member 28 is retired from the accommodation/take-out line of the IC package 12.

The operation member 21 has a square frame shape, which is arranged on the periphery of the accommodation member 19 and the socket body 13 to be movable in the vertical direction. The operation member 21 has a pressing surface 21*a* pressing a surface 17*e* to be pressed (pressed surface 17*e*) formed on the upper surface of the projection piece 17*c* of the movable member 17, and when pressed, the movable member 17 is moved downward against the urging force of the coil spring 25.

The IC socket 11 having the structure mentioned above will be usable in a manner described hereunder.

A printed circuit board on which a number of IC sockets 11 are arranged is preliminarily prepared, and then, in order to set the IC packages 12 respectively to the IC sockets 11 by using an automatic machine, the operation member 21 is first pressed downward.

According to this lowering motion of the operation member 21, the movable member 17 is pressed downward and then lowered against the urging force of the coil spring 25.

When the operation member 21 is lowered from the state shown in FIG. 4, the pressing surface 21*a* of the operation member 21 abuts against the pressed surface 17*e* of the movable member 17 and then presses the same, thereby lowering the movable member 17 as shown in FIG. 5.

The lowering motion of the movable member 17 opens both paired contact portions 15*d* of each of the contact pins 15 and, hence, opens the latch member 28.

That is, when the movable member 17 is lowered, the portion 28*b* to be pressed of the latch member 28 is pressed by the pressing portion 17*d*, and against the urging force of the spring 29, the latch member 28 is rotated to the position shown with the two-dots-chain line in FIG. 3, and accordingly, the pressing portion 28*c* of the latch member 28 is retired from the accommodation/take-out line of the IC package 12.

Further, when the movable member 17 is lowered from the position shown in FIG. 6 to the position shown in FIG. 7, the bulged portions 15*h* of the elastic pieces 15*c* of each contact pin 15 are pressed against the peripheral wall portions of the insertion hole 17*a* of the movable member 17, and hence, the contact portions 15*d* of each contact pin 15 are opened, i.e., separated from each other.

In the state mentioned above, the IC package 12 is guided by the guides 19*b* and accommodated on the predetermined portion on the support pieces 19*a*, and the solder balls 12*b* of the IC package 12 are inserted, in non-contact state, between the opened pair of contact portions 15*d* of the contact pins 15, respectively, as shown in FIG. 7.

Thereafter, when the downward pressing force of the operation member 21 is released, the movable member 17 moves upward by the urging force of the coil spring 25, and then, the latch member 28 is rotated to the position in the closing direction by the urging force of the spring 29. Thus, the floating of the IC package 12 can be prevented by the pressing of the latch member 28.

Moreover, when the movable member 17 is moved upward, the pressing force to the slidable portions 15g of the contact pin 15 is released, and is then moved in the direction along which the paired contact portions 15d are closed (that is, the distance therebetween is narrowed) from the state shown in FIG. 7, thereby holding the solder ball 12b between both the contact portions 15d.

Therefore, the respective solder balls 12b of the IC package 12 and the printed circuit board are electrically connected through the contact pins 15, i.e., through the deformation of the contact pieces of the contact pins.

On the other hand, when the IC package 12 is dismounted from the state mounted to the socket, the movable member 17 is first lowered by the operation of the operation member 21 so as to retire the latch member 28 from the accommodation/take-out range, and then, the paired contact portions 15d of each contact pin 15 are separated from the solder ball 12b, so that when the solder ball 12b is pulled out of the clamped state between the paired contact portions 15d, the solder ball 12b can be easily pulled out with weak force, thus easily removing the IC package 12.

According to the present invention of the structures mentioned above, the projection piece 17c projecting upward from the movable member body 17b is formed to the movable member 17, and the pressed surface 17e of the upper surface of the projection piece 17c is directly pressed by the operation member 21, so that it is not necessary to locate, as in the conventional structure, a link member, thus reducing the number of members or elements.

In addition, by forming the projecting piece 17c projecting upward from the movable member body 17b, it is not necessary to form, to the operation member 21, any projection piece pressing the movable member 17, thus simplifying the structure and ensuring the strength and durability of the members. Further, in a case that a projection piece projecting downward is formed to the operation member 21, it is necessary to form it to have a shape recessed in the socket body 13, which may result in a complicated structure of the operation member 21, and moreover, the projection piece will provide a fine slender structure having weak structure, thus being disadvantageous.

Furthermore, the pressed surface 17e of the movable member 17 has a horizontal flat surface perpendicular to the pressing direction (vertical direction), and accordingly, different from an inclined surface, there is no friction between the pressing surface 21a of the operation member 21 and the pressed surface 17e of the movable member 17, thus ensuring the durability.

Still furthermore, since the accommodation member 19 is disposed inside the projecting piece 17c, when the operation member 21 pushes the projection piece 17c, the accommodation member 19 does not constitute an obstacle. In addition, as it is necessary to accommodate the IC package 12 above the movable member 17 moving vertically, the accommodation member 19 is disposed inside the projection piece 17c, so that the IC package 12 can be suitably accommodated in this accommodation member 19.

Moreover, the accommodation member 19 is disposed detachably to the socket body 13 by means of engaging piece 19c, so that when the accommodation member 19 is dismounted, the movable member 17 can be also easily dismounted.

Further, since the accommodation member 19 is provided with the guide piece 19b, the IC package 12 can be easily and smoothly guided to the predetermined mount position.

[Second Embodiment]

FIGS. 15 to 19 represent the second embodiment of the present invention.

The second embodiment differs from the first embodiment in that an operation 21 in the first embodiment is not located, and the guide member only includes the support piece 19a and does not include the guide 19b.

In such structure of the second embodiment, the pressed surface 17e (horizontal surface) formed on the upper surface of the projection piece 17c of the movable member 17 is directly pressed by a head disposed on the package insertion/take-out device side, not shown.

Accordingly, with no use of the operation member 21, the number of constitutional members or parts can be reduced, and in addition, by forming the projection piece 17c projecting upward from the movable member body 17b, it is not necessary to form any projection piece pressing the movable member 17 to the head on the package insertion/take-out device side, thus simplifying the structure and ensuring suitable strength and durability. Further, in a case that a projection piece projecting downward is formed to the head on the package insertion/take-out device side in a shape recessed in the socket body 13, it is further troublesome in comparison with the case of the formation to the operation member 21.

Furthermore, the pressed surface 17e of the movable member 17 has a horizontal flat surface perpendicular to the pressing direction (vertical direction), and accordingly, different from an inclined surface, there is no friction between the pressing surface 21a of the head side and the pressed surface 17e of the movable member 17, ensuring the durability.

The structures of the second embodiment other than the above different structure are substantially the same as those of the first embodiment, so that the details thereof are omitted herein.

Further, it is to be noted that the present invention is not limited to the described embodiments and many other changes and modifications may be made without departing from the scopes of the appended claims.

For example, in the described embodiments, although the present invention is utilized as the IC socket 11 for as a socket for electrical parts, the present invention is not limited thereto and may be applied to another device. Moreover, although the present invention is applied to the IC socket 11 for the BGA type IC package 12, it may be applied to an IC socket for a PGA (Pin Grid Array) type IC package. Furthermore, the shape and location of the projection piece 17c are not limited to the described ones as far as the projection piece of the movable member of the present invention projects upward from the movable member body.

What is claimed is:

1. A socket for an electrical part comprising:
   a socket body to which an electrical part is accommodated, the socket body having a base portion to which a plurality of contact pins, having elastic pieces, which are contacted to or separated from terminals of the electrical part, are arranged; and
   a movable member disposed to the socket body above the base portion thereof to be vertically movable, deformation of the elastic pieces of the contact pins inserted into insertion holes formed to the movable member being performed in accordance with the vertical movement of the movable member, according to the deformation thereof, contact portions formed to the contact pins being opened or closed, said movable member including a movable member body disposed substantially horizontally and formed with the insertion holes into which the contact pins are inserted and a projection projecting upward from the movable member body, said projection having an upper surface to which a pressed surface is formed, wherein when the pressed surface is pressed, the movable member is lowered, wherein the projection is formed from an outer peripheral edge portion of the movable member body, and an accommodation member in which the electrical part is accommodated is formed from the outer peripheral edge portion of the movable member body at a position inside the projection.

2. The socket for an electrical part according to claim 1, wherein said pressed surface of the projection is formed so as to be along substantially a horizontal direction.

3. The socket for an electrical part according to claim 1, wherein said accommodation member is provided with an engaging piece through which the accommodation member is detachably provided for the socket body.

4. The socket for an electrical part according to claim 1, wherein said accommodation member is provided with a guide piece for guiding the electrical part when the electrical part is accommodated.

5. The socket for an electrical part according to claim 1, further comprising an operation member mounted to the socket body to be vertically movable, said operation member being formed with a pressing surface pressing the pressed surface.

6. A socket for an electrical part comprising:
a socket body to which an electrical part is accommodated, the socket body having a base portion;
a plurality of contact pins arranged on the base portion, each contact pin having
a contact portion which can be closed to contact a corresponding terminal of the electrical part, and can be opened to separate from the corresponding terminal, and
an elastic portion which is deformable to open and close the contact portion;
a movable member including a movable member body disposed substantially horizontally and formed with a plurality of insertion holes corresponding, respectively, to the plurality of contact pins, wherein
the movable member is disposed above the base portion of the socket body to be vertically movable with respect to the socket body, and so that the vertical movement of the movable member causes each contact pin to be inserted in the corresponding insertion hole to thereby cause the elastic portion of the respective contact pin to be deformed and, according to the deformation, cause the contact portion of the respective contact pin to be opened or closed, and the movable member includes a projection projecting upward from the movable member body and formed from an outer peripheral edge portion of the movable member body, the projection having an upper surface which, when pressed, causes the movable member to be vertically lowered which thereby causes the elastic portions of the contact pins to be deformed and, according to the deformation, causes the contact portions of the contact pins to be opened; and an accommodation member formed from the outer peripheral edge portion of the movable member body at a position inside the projection, and accommodating the electrical part.

7. The socket for an electrical part according to claim 6, wherein the upper surface of the projection has a pressed surface formed along substantially a horizontal direction and, when pressed, causes the movable member to be vertically lowered.

8. The socket for an electrical part according to claim 6, wherein the accommodation member is provided with an engaging piece through which the accommodation member is detachably provided for the socket body.

9. The socket for an electrical part according to claim 6, wherein the accommodation member is provided with a guide piece for guiding the electrical part when the electrical part is accommodated.

10. The socket for an electrical part according to claim 6, wherein
the upper surface of the projection has a pressed surface which, when pressed, causes the movable member to be vertically lowered, and
the socket further comprises an operation member mounted to the socket body to be vertically movable, the operation member being formed with a pressing surface pressing the pressed surface.

11. The socket for an electrical part according to claim 6, wherein, when the movable member is vertically moved upward, the elastic portions of the contact pins are thereby caused to be deformed which, according to the deformation, causes the contact portions of the contact pins to be closed.

* * * * *